United States Patent
Park

(10) Patent No.: US 12,293,977 B2
(45) Date of Patent: May 6, 2025

(54) SEMICONDUCTOR PACKAGE INCLUDING SHIELDING COVER THAT COVERS MOLDED BODY

(71) Applicant: SAMSUNG ELECTRONICS CO., LTD., Suwon-si (KR)

(72) Inventor: Young-Woo Park, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/429,039

(22) Filed: Jan. 31, 2024

(65) Prior Publication Data

US 2024/0213177 A1 Jun. 27, 2024

Related U.S. Application Data

(60) Division of application No. 17/117,547, filed on Dec. 10, 2020, now Pat. No. 11,923,319, which is a
(Continued)

(30) Foreign Application Priority Data

Jun. 26, 2018 (KR) .................. 10-2018-0073589

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4817* (2013.01); *H01L 21/4853* (2013.01);
(Continued)

(58) Field of Classification Search
CPC .............. H01L 21/4853; H01L 21/565; H01L 23/3128; H01L 23/49838; H01L 24/48;
(Continued)

(56) References Cited

U.S. PATENT DOCUMENTS 6,092,281 A 7/2000 Glenn
6,815,808 B2 * 11/2004 Hyodo .................. H01L 23/055
257/729

(Continued)

FOREIGN PATENT DOCUMENTS

CN 107871728 4/2018
JP H10214923 8/1998
(Continued)

OTHER PUBLICATIONS

Office Action in Chinese Appln. No. 201910256661.3, mailed on Oct. 17, 2022, 9 pages.
(Continued)

*Primary Examiner* — Jami Valentine Miller
(74) *Attorney, Agent, or Firm* — Fish & Richardson P.C.

(57) ABSTRACT

A method of fabricating a semiconductor package includes mounting at least one semiconductor chip to a package substrate, forming a shielding wall around the at least one semiconductor chip, forming a molded body on the package substrate in a space surrounded by the shielding wall, and forming a shielding cover covering the molding unit and in contact with the shielding wall.

20 Claims, 11 Drawing Sheets

Related U.S. Application Data continuation of application No. 16/224,556, filed on Dec. 18, 2018, now Pat. No. 10,943,872.

(51) Int. Cl.
| | |
|---|---|
| *H01L 21/56* | (2006.01) |
| *H01L 23/00* | (2006.01) |
| *H01L 23/053* | (2006.01) |
| *H01L 23/31* | (2006.01) |
| *H01L 23/498* | (2006.01) |
| *H01L 25/00* | (2006.01) |
| *H01L 25/065* | (2023.01) |
| *H01L 25/10* | (2006.01) |

(52) U.S. Cl.
CPC .......... *H01L 21/565* (2013.01); *H01L 23/053* (2013.01); *H01L 23/3128* (2013.01); *H01L 23/49838* (2013.01); *H01L 24/48* (2013.01); *H01L 25/0657* (2013.01); *H01L 25/105* (2013.01); *H01L 25/50* (2013.01); *H01L 2224/48157* (2013.01); *H01L 2225/06506* (2013.01); *H01L 2225/0651* (2013.01); *H01L 2225/06537* (2013.01); *H01L 2225/06562* (2013.01); *H01L 2225/06586* (2013.01); *H01L 2225/1023* (2013.01); *H01L 2225/1058* (2013.01); *H01L 2924/3025* (2013.01)

(58) Field of Classification Search
CPC ... H01L 25/0657; H01L 25/105; H01L 25/50; H01L 2225/1058
USPC ........................................................ 438/107
See application file for complete search history.

(56) References Cited

U.S. PATENT DOCUMENTS

| | | | |
|---|---|---|---|
| 8,178,956 | B2 | 5/2012 | Do et al. |
| 9,355,969 | B2 | 5/2016 | Park |
| 9,484,279 | B2 | 11/2016 | Pagaila et al. |
| 9,721,903 | B2 | 8/2017 | Lee et al. |
| 9,978,693 | B2 | 5/2018 | Jeong et al. |
| 2003/0102540 | A1 | 6/2003 | Lee |
| 2006/0102992 | A1 | 5/2006 | Kwon et al. |
| 2012/0228751 | A1 | 9/2012 | Song |
| 2016/0262292 | A1* | 9/2016 | Kuk ............... H05K 1/0218 |
| 2017/0062352 | A1* | 3/2017 | Choi ............... H01L 23/552 |
| 2017/0325365 | A1 | 11/2017 | Kuk et al. |
| 2017/0345793 | A1 | 11/2017 | Miyairi |
| 2019/0311994 | A1* | 10/2019 | Hong ............... H01L 21/56 |
| 2019/0348372 | A1* | 11/2019 | Jun ............... H01L 25/50 |

FOREIGN PATENT DOCUMENTS

| | | |
|---|---|---|
| JP | 2006294701 | 10/2006 |
| JP | 2007157891 | 6/2007 |
| JP | 2012190960 | 10/2012 |
| JP | 2013197209 | 9/2013 |
| JP | 2018041899 | 3/2018 |
| KR | 100600169 | 7/2006 |
| KR | 1020080004731 | 1/2008 |
| KR | 100887558 | 3/2009 |
| KR | 101349546 | 1/2014 |
| KR | 1020160108117 | 9/2016 |
| KR | 101787871 | 10/2017 |
| KR | 1020180032985 | 4/2018 |

OTHER PUBLICATIONS

Office Action in Korean Appln. No. 10-2018-0073589, mailed on Feb. 15, 2023, 6 pages.

* cited by examiner

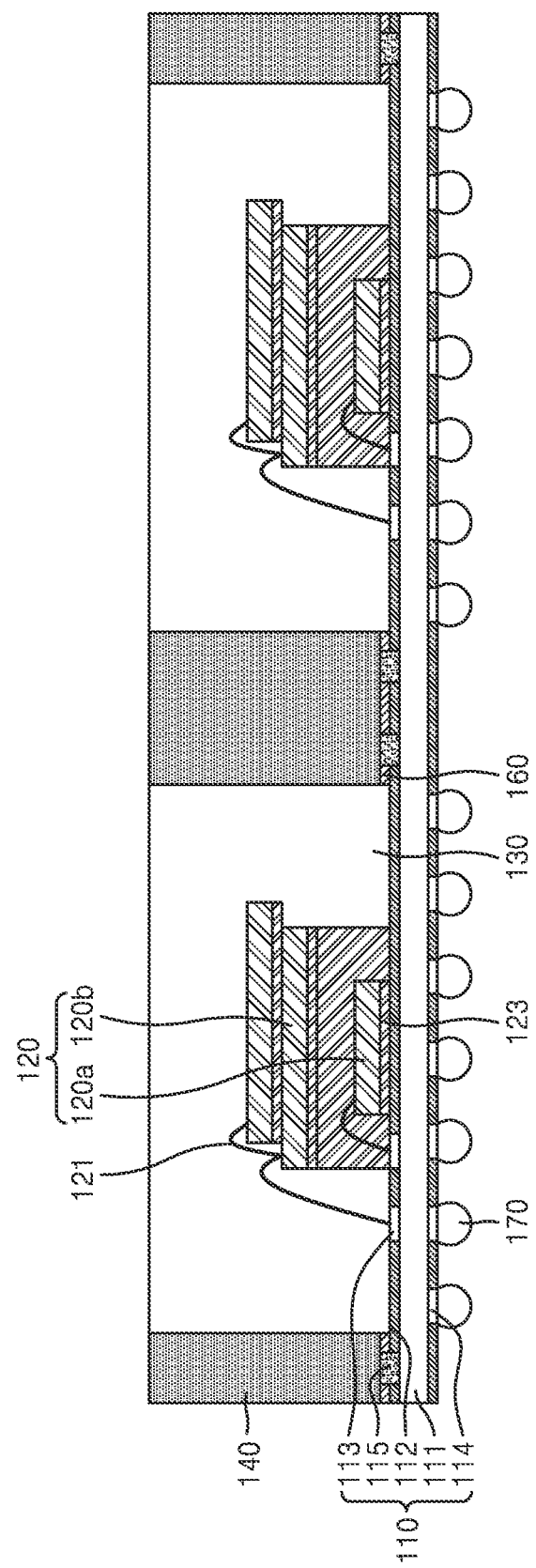

SEMICONDUCTOR PACKAGE INCLUDING SHIELDING COVER THAT COVERS MOLDED BODY

PRIORITY STATEMENT

This is application is a division of U.S. application Ser. No. 17/117,547, filed Dec. 10, 2020, which is a continuation of U.S. application Ser. No. 16/224,556, filed Dec. 18, 2018, and a claim of priority is made to Korean Patent Application No. 10-2018-0073589, filed on Jun. 26, 2018, in the Korean Intellectual Property Office, the disclosures of which are hereby incorporated by reference in their entireties.

BACKGROUND

The inventive concept relates to a semiconductor package and to a method of fabricating a semiconductor package.

A semiconductor chip of a semiconductor package may operate abnormally due to electromagnetic interference (EMI). Electromagnetic interference (EMI) in this context refers to a phenomenon in which an electronic device external but adjacent to the package generates an electric field which is superimposed on and hence, alters the operation, of the chip of the package. Electromagnetic interference shielding has been created to ameliorate the affect of EMI. Such electromagnetic interference shielding in a semiconductor package is becoming more important as the distance between semiconductor packages is becoming smaller in accordance with the demand for smaller electronic product. An electromagnetic interference shielding structure of a semiconductor package has been fabricated by an electroplating or a physical vapor deposition (PVD).

SUMMARY

According to an aspect of the inventive concept, there is provided a method of fabricating a semiconductor package, the method including: mounting at least one semiconductor chip to an upper surface of a package substrate, forming a shielding wall that extends around sides of the at least one semiconductor chip above the package substrate, forming a molded body in a space delimited by the shielding wall and the package substrate, and forming a shielding cover that covers the molded body and contacts the shielding wall.

According to another aspect of the inventive concept, there is provided a method of fabricating a semiconductor package, the method including: providing a package substrate comprising a base having an upper surface, a solder resist layer on the upper surface of the base and a protrusion contacting the base and extending into the solder resist layer, mounting at least one semiconductor chip to the package substrate atop the upper surface of the base, attaching to the package substrate a shielding wall that extends over the protrusion and circumferentially around the at least one semiconductor chip, forming a molded body in a space delimited by the shielding wall and the package substrate, and forming a shielding cover covering the molded body and in contact with the shielding wall.

According to another aspect of the inventive concept, there is provided a method of fabricating a semiconductor package, the method including: mounting semiconductor chips on an upper surface of a package substrate in a horizontal array in which respective chips of the array are spaced laterally from each other in a direction parallel to the upper surface of the package substrate, forming a shielding wall extending around each of the semiconductor chips above the package substrate, depositing molding material in spaces delimited by the shielding wall and the package substrate, curing or allowing the molding material to cure to thereby form molded bodies that encapsulate the semiconductor chips on the package substrate within the spaces, respectively, cutting through the shielding wall and the package substrate in regions between the semiconductor chips of the array, and forming a shielding cover that covers each of the molded bodies.

According to another aspect of the inventive concept, there is provided a method of fabricating a semiconductor package, the method including: forming a package substrate comprising a base of electrically insulating material, an upper pad of electrically conductive material at an upper surface of the base, and a protrusion of electrically conductive material extending upright on the upper surface of the base, disposing at least one semiconductor chip in a chip mounting region of the semiconductor package above the package substrate and electrically connecting the at least one semiconductor chip to the upper pad of the package substrate, forming an electromagnetic radiation shielding wall that delimits the chip mounting region with the upper surface of the package substrate by walling in the chip mounting region of the semiconductor package with a fence of electrically conductive material disposed in contact with the protrusion of the package substrate, depositing a molding compound in the chip mounting region delimited by the electromagnetic radiation shielding wall and the upper surface of the package substrate after the at least one semiconductor chip has been disposed in the chip mounting region and electrically connect to the upper pad of the package substrate, curing or allowing the molding compound to cure to thereby form a molded body that encapsulates the at least one semiconductor chip on the package substrate, and forming a cover of electrically conductive material, serving as an electromagnetic radiation cover shield, over the molded body as disposed in contact with the electromagnetic radiation shielding wall.

BRIEF DESCRIPTION OF THE DRAWINGS

The inventive concept will be more clearly understood from the following detailed description taken in conjunction with the accompanying drawings in which:

FIGS. 8A, 8B, 8C and 8D are cross-sectional views of a semiconductor package during the course of its manufacture and together illustrate an example of a method of fabricating a semiconductor package according to the inventive concept;

DETAILED DESCRIPTION

Figure 1:
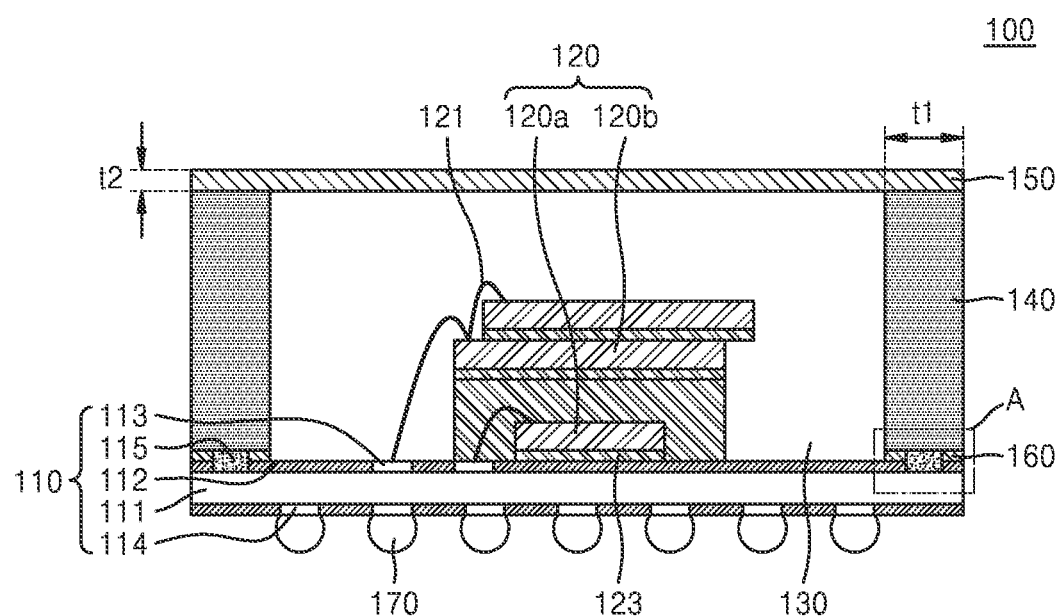
FIG. 1 is a cross-sectional view of an example of a semiconductor package according to the inventive concept.

Examples of semiconductor packages and methods of fabricating the same, according to the inventive concept, will now be described in more detail with respect to the drawings. Note, a single element or feature may be referred to in the following description for the sake of convenience although a semiconductor package according to the inventive concept may have a plurality of such elements or features as shown in the drawings.

Figure 2:
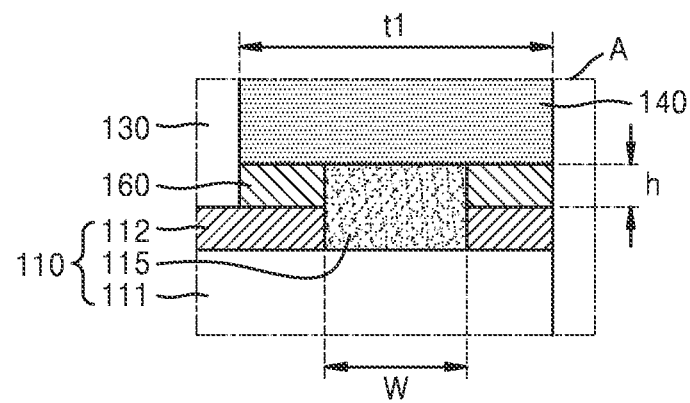
FIG. 2 is an enlarged view of an area A of the semiconductor package of FIG. 1.

FIG. 1 is a cross-sectional view of a semiconductor package 100 according to the inventive concept. FIG. 2 is an enlarged view of an area A of the semiconductor package 100 shown in FIG. 1.

Referring to FIG. 1 and FIG. 2 together, the semiconductor package 100 may include a package substrate 110, an external connecting unit 170, at least one semiconductor chip 120, a molding unit 130, a shielding wall 140, and a shielding cover 150.

The package substrate 110 may be, for example, a printed circuit board (PCB). The package substrate 110 may include at least one base layer 111 of electrically insulating material (which layer or layers may be referred to simply as the "base" of the package substrate), a solder resist layer 112, an upper pad 113, a lower pad 114, and a protruding unit 115. The base layer 111 may be formed of an epoxy resin, a polyester resin, a polyimide resin, or a combination thereof. The base layer 111 may be formed of, for example, a glass fiber epoxy composite material. The solder resist layer 112 may cover an upper surface and a lower surface of the base layer 111. The upper pad 113 may be positioned at and more specifically, above the upper surface of the base layer 111 and may not be covered by the solder resist layer 112. The lower pad 114 may be positioned at and more specifically on the lower surface of the base layer 111 and may not be covered by the solder resist layer 112. The upper pad 113 and the lower pad 114 comprise a conductive material such as copper (Cu). The upper pad 113 and the lower pad 114 may be connected to each other through an interconnection (not shown) in the base layer 111. The protruding unit 115 may extend from the base layer 111 to a lower end surface of the shielding wall 140. That is, one end of the protruding unit 115 may be in contact with the base layer 111, and the other end of the protruding unit 115 may be in contact with the lower end surface of the shielding wall 140. The protruding unit 115 may comprise a conductive material such as copper (Cu). The protruding unit 115 may be positioned adjacent to an edge of the package substrate 110. The protruding unit 115 has a width W in a direction parallel to the package substrate 110. In addition, the protruding unit 115 protrudes from the solder resist layer 112 by a distance h.

The external connecting unit 170 may be arranged on the lower pad 114 of the package substrate 110. The external connecting unit 170 may comprise gold (Au), copper (Cu), nickel (Ni), tin (Sn), lead (Pb), or a combination thereof. The external connecting unit 170 may comprise a plurality of terminals, e.g., solder balls.

The semiconductor chip 120 may be a logic chip or a memory chip. In the case of the former, the logic chip may be, for example, a memory controller chip, a central processing unit (CPU) chip, a graphics processing unit (GPU) chip, or an application processor (AP) chip. In the case of the latter, the memory chip may be, for example, a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip. In any case, the semiconductor chip 120 may be attached to an upper surface of the package substrate 110, within a "chip mounting region" of the package, by a chip adhesive layer 123. The semiconductor chip 120 may be electrically connected to the package substrate 110 by a bonding wire 121. In other examples, the semiconductor chip 120 is connected to the package substrate 110 by a conductive bump. The semiconductor chip 120 may be spaced apart from the shielding wall 140 and the shielding cover 150.

In some examples, the at least one semiconductor chip 120 may include a first semiconductor chip 120a and a plurality of second semiconductor chips 120b. The first semiconductor chip 120a and the second semiconductor chip 120b may be of different types. For example, the first semiconductor chip 120a may be a logic chip and the second semiconductor chip 120b may be a memory chip. However, the numbers and types of semiconductor chips of the semiconductor package 100 are not limited to those shown in the figures and/or described above.

The molding unit 130 may cover the upper surface of the package substrate 110 and encapsulate the at least one semiconductor chip 120 in the chip mounting region atop the package substrate 110. The molding unit 130 may be formed of a thermosetting resin, a thermoplastic resin, a UV curable resin, or a combination thereof. The molding unit 130 may comprise, for example, an epoxy resin, a silicone resin, or a combination thereof. The molding unit 130 may be formed of, for example, an epoxy mold compound (EMC).

The shielding wall 140 may extend circumferentially around the molding unit 130. Thus, the shielding wall may fence in the chip mounting region within which the at least one chip 120 is mounted to the package substrate. One end of the shielding wall 140 may contact the protruding unit 115 of the package substrate 110 and the other end of the shielding wall 140 may be in contact with the shielding cover 150. The shielding wall 140 is formed of conductive material such as copper (Cu,) nickel (Ni), silver (Ag), gold (Au) iron (Fe), or a combination thereof. The shielding wall 140 may have a first thickness t1 in a direction parallel to an upper surface of the package substrate 110, namely, the upper surface of the base layer 11 of the package substrate 110. The first thickness t1 of the shielding wall 140 may be, for example, about 10 μm to 500 μm. The shielding wall 140 may be grounded through the protruding unit 115 of the package substrate 110. The first thickness t1 of the shielding wall 140 may be greater than the width W of the protruding unit 115, i.e., the aforementioned dimension of the protruding unit 115 in the direction parallel to the package substrate 110. In addition, the first thickness t1 of the shielding wall 140 may be greater than the height h of the protruding unit 115, i.e., the aforementioned distance from the solder resist layer 112 to an upper surface of the protruding unit 115 in a direction perpendicular to the upper surface of the package substrate 110.

In some examples, the shielding wall 140 is attached to the package substrate 110 by a shielding wall adhesive layer 160. The shielding wall adhesive layer 160 may be interposed between the upper surface of the solder resist layer 112 of the package substrate 110 and the shielding wall 140. The protruding unit 115 of the package substrate 110 may extend through the shielding wall adhesive layer 160. The shielding wall adhesive layer 160 may be, for example, an epoxy resin.

The shielding cover 150 may cover an upper surface of the molding unit 130 and be in contact with the shielding wall 140. The shielding cover 150 may be formed of conductive material such as copper (Cu), nickel (Ni), silver (Ag), gold (Au), iron (Fe), or a combination thereof. In some examples, the shielding cover 150 is an electromagnetic radiation absorbing tape. In some examples, the shielding cover 150 is of a different material from the shielding wall 140. For example, the shielding wall 140 may include copper (Cu) and the shielding cover 150 may be an electromagnetic radiation absorbing tape. The shielding cover 150 may have a thickness t2 in the direction perpendicular to the package substrate 110. In some examples, the thickness t1 of the shielding wall 140 is different from the thickness t2 of the shielding cover 150. In particular, the thickness t1 of the shielding wall 140 may be greater than the thickness t2 of the shielding cover 150. The shielding cover 150 may be grounded through the shielding wall 140 and the protruding unit 115 of the package substrate 110.

Figure 3A:
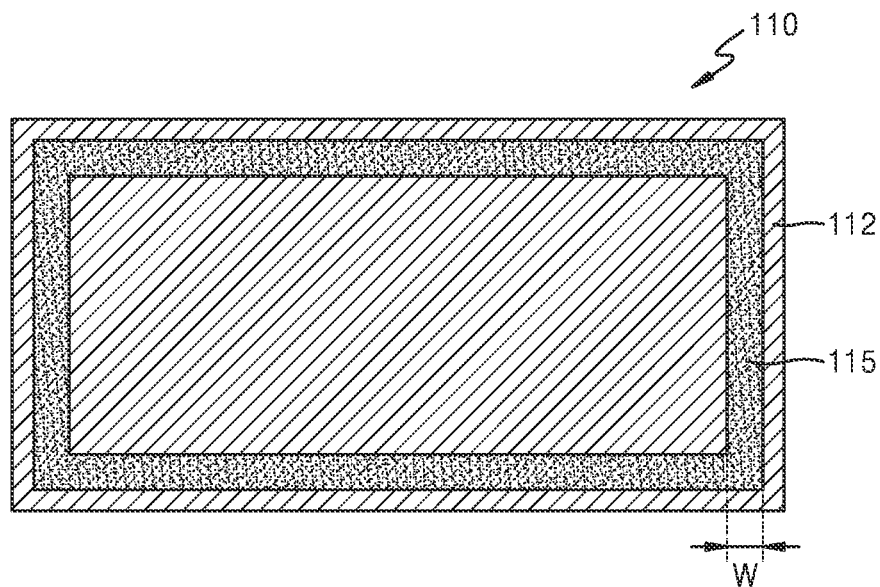
FIG. 3A is a plan view of a protruding unit of a package substrate.

FIG. 3A is a plan view of one version of the protruding unit 115 of the package substrate 110.

Referring to FIG. 3A, the protruding unit 115 of the package substrate 110 may extend along a closed curve. In addition, the protruding unit 115 of the package substrate 110 may extended adjacent to, i.e., alongside, the perimeter of the package substrate 110. In some examples, the package substrate 110 has an approximately rectangular shape. However, the shape of the protruding unit 115 is not limited to being rectangular.

Figure 3B:
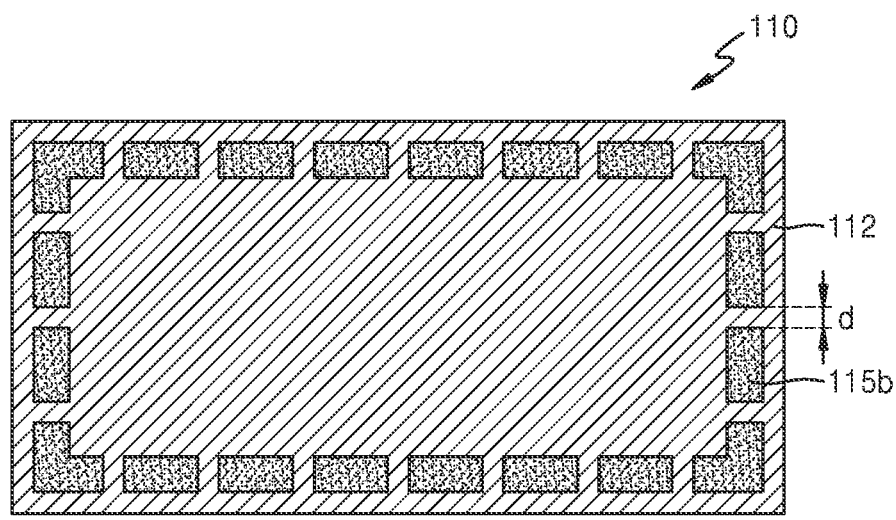
FIG. 3B is a plan view of a protruding unit of a package substrate.

FIG. 3B is a plan view of another version of the protruding unit 115*b* of the package substrate 110.

Referring to FIG. 3B, the protruding unit 115*b* of the package substrate 110 may include a plurality of portions which are spaced apart from each other. A distance d between the plurality of portions of the protruding unit 115*b* and the distance h (see FIG. 2) from the upper surface of the solder resist layer 112 to the upper surface of the protruding unit 115*b* are small enough to allow the protruding unit 115*b* to effect electromagnetic shielding. The plurality of portions of the protruding unit 115*b* may be arranged along a closed curve. For example, the package substrate 110 may have an approximately rectangular shape and the plurality of portions of the protruding unit 115*b* may be arranged along an approximately rectangular path corresponding to the shape of the perimeter of the package substrate 110. However, the shape of the closed path along which the portions of the protruding unit 115*b* are laid out is not limited to being rectangular.

Figure 3C:
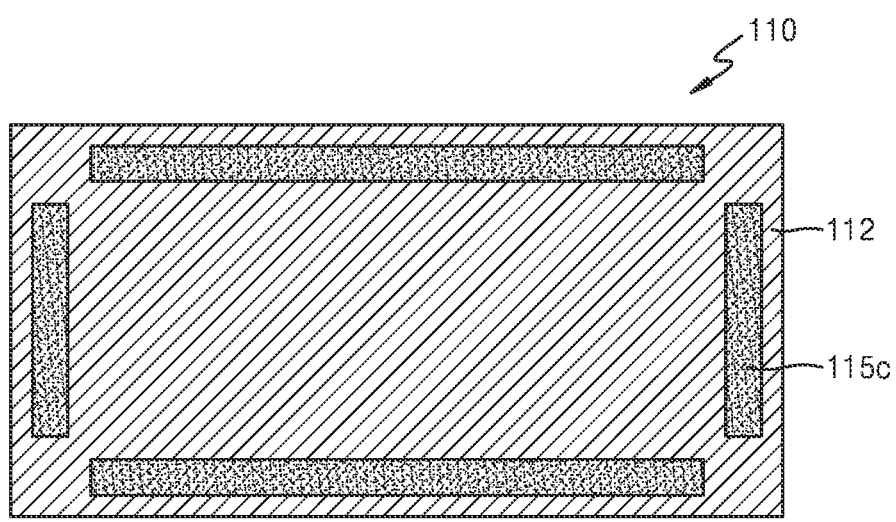
FIG. 3C is a plan view of a protruding unit of a package substrate.

FIG. 3C is a plan view of still another version of the protruding unit 115*c* of the package substrate 110.

Referring to FIG. 3C, the protruding unit 115*c* of the package substrate 110 may include a plurality of portions respectively adjacent to edges of the package substrate 110. In some examples, the package substrate 110 has an approximately rectangular shape with four edges and the protruding unit 115*c* may have four portions respectively adjacent to four edges of the package substrate 110.

Figure 4:
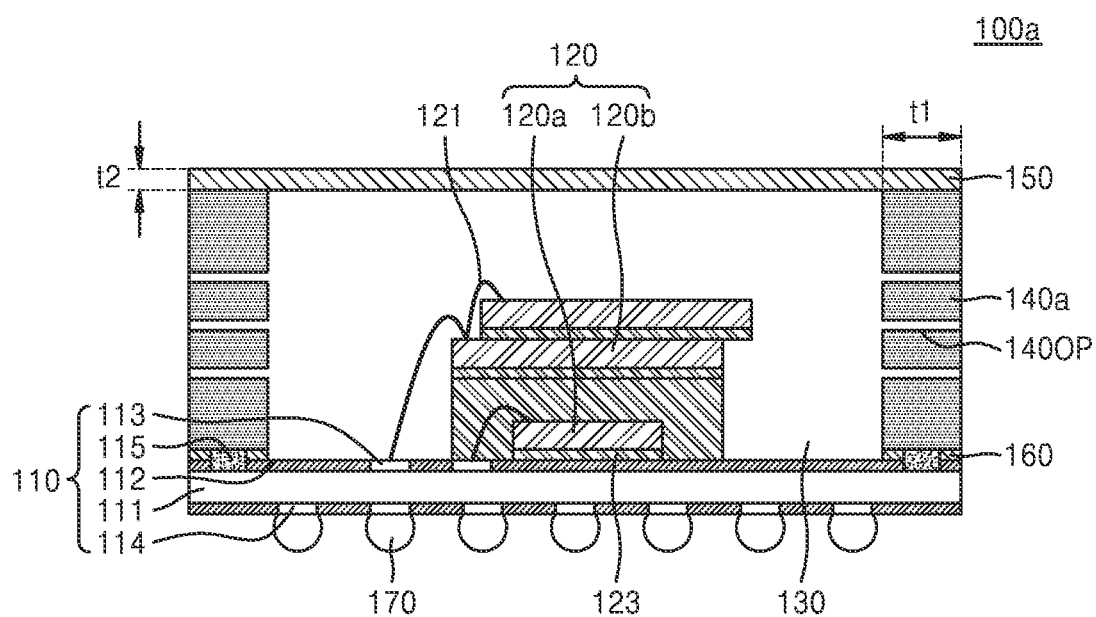
FIG. 4 is a cross-sectional view of another example of a semiconductor package according to the inventive concept.

FIG. 4 is a cross-sectional view of another example of a semiconductor package 100*a* according to the inventive concept. Hereinafter, mostly only differences between the semiconductor package 100 shown in FIG. 1 and the semiconductor package 100*a* shown in FIG. 4 will be described.

Referring to FIG. 4, a shielding wall 140*a* may have at least one opening 140OP extending radially therethrough. The opening 140OP may be a hole or a slit. The opening 140OP is small enough to allow the shielding wall 140*a* to still effect an electromagnetic shielding of the at least one semiconductor package 120. The opening 140OP may have any shape (cross section). When a space surrounded by the shielding wall 140*a* is filled with molding compound (described later), the opening 140OP may allows excess molding material to pass through the shielding wall 140*a*.

Figure 5:
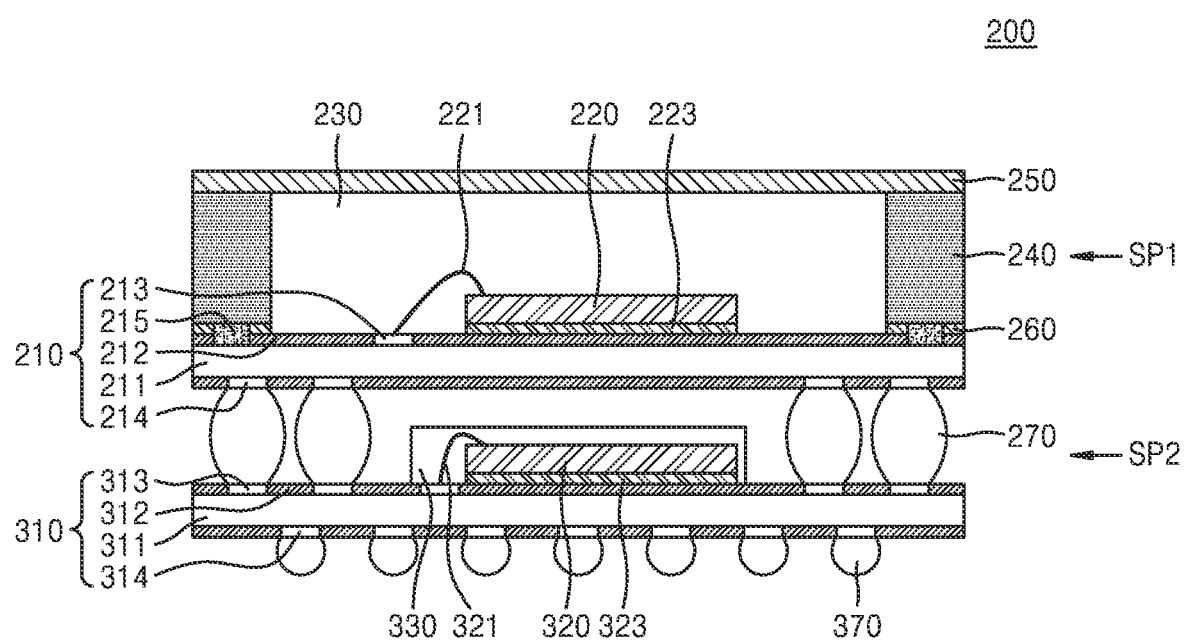
FIG. 5 is a cross-sectional view of another example of a semiconductor package according to the inventive concept.

FIG. 5 is a cross-sectional view of still another example of a semiconductor package 200 according to the inventive concept.

Referring to FIG. 5, the semiconductor package 200 may include a first sub-package SP1, a second sub-package SP2, and a plurality of inter-package connecting units 270. That is, the semiconductor package 200 may be a package on package (POP) semiconductor device.

The first sub-package SP1 may include a first package substrate 210, a first semiconductor chip 220, a first molding unit 230, a first shielding wall 240, and a first shielding cover 250.

The first package substrate 210 may be, for example, a PCB. The first package substrate 210 may include a base layer 211, a solder resist layer 212, an upper pad 213, a lower pad 214, and a protruding unit 215. The solder resist layer 212 may cover an upper surface and a lower surface of the base layer 211. The upper pad 213 may be positioned above the upper surface of the base layer 211 and may not be covered by the solder resist layer 212. The lower pad 214 may be positioned on the lower surface of the base layer 211 and may not be covered by the solder resist layer 212. The upper pad 213 and the lower pad 214 may be connected to each other through an interconnection (not shown) in the base layer 211. The protruding unit 215 may extend from the base layer 211 to a lower surface of the first shielding wall 240. That is, one end of the protruding unit 215 may be in contact with the base layer 211 and the other end thereof may be in contact with the lower surface of the first shielding wall 240. The protruding unit 215 may be positioned adjacent to an edge of the first package substrate 210.

The first semiconductor chip 220 may be a logic chip or a memory chip. The first semiconductor chip 220 may be attached to an upper surface of the first package substrate 210 by a chip adhesive layer 223. The first semiconductor chip 220 may be connected to the first package substrate 210 by a bonding wire 221. In another example, the first semiconductor chip 220 is connected to the first package substrate 210 by a bump. Also, the first semiconductor chip 220 is spaced apart from the first shielding wall 240 and the first shielding cover 250.

The first molding unit 230 may cover an upper surface of the first package substrate 210 and surround the first semiconductor chip 220.

The first shielding wall 240 may extend around sides of the first molding unit 230. One end of the first shielding wall 240 may be in contact with the protruding unit 215 of the first package substrate 210 and another end of the first shielding wall 240 may be in contact with the first shielding cover 250.

In some examples, the first shielding wall 240 is attached to the first package substrate 210 by a first shielding wall adhesive layer 260. The first shielding wall adhesive layer 260 may be positioned between the solder resist layer 212 of the first package substrate 210 and the lower surface of the first shielding wall 240. The protruding unit 215 of the first package substrate 210 may extend through the first shielding wall adhesive layer 260.

The first shielding cover 250 may cover an upper surface of the first molding unit 230 and be in contact with the first shielding wall 240.

The second sub-package SP2 may include a second package substrate 310, a second semiconductor chip 320, a second molding unit 330, and an external connecting unit 370.

The second package substrate 310 may be, for example, a PCB. The second package substrate 310 may include a base layer 311, a solder resist layer 312, an upper pad 313, and a lower pad 314. The solder resist layer 312 may cover an upper surface and a lower surface of the base layer 311. The upper pad 313 may be positioned above the upper surface of the base layer 311 and may not be covered by the solder resist layer 312. The lower pad 314 may be positioned on the lower surface of the base layer 311 and may not be covered by the solder resist layer 312. The upper pad 313 and the lower pad 314 may be connected to each other through an interconnection (not shown) in the base layer 211.

The second semiconductor chip 320 may be a logic chip or a memory chip. The second semiconductor chip 320 may be attached to an upper surface of the second package substrate 310 by a chip adhesive layer 323. The second semiconductor chip 320 may be connected to the second package substrate 310 by a bonding wire 321. In other examples, the second semiconductor chip 320 is connected to the second package substrate 310 by a bump.

The second molding unit 330 may cover at least a portion of the upper surface of the second package substrate 310 and surround the second semiconductor chip 320.

The external connecting unit 370 may be arranged on the lower surface of the second package substrate 310.

The inter-package connecting unit 270 may be arranged between the first sub-package SP1 and the second sub-package SP2. In particular, the inter-package connecting unit 270 may be arranged between the first package substrate 210 of the first sub-package SP1 and the second package substrate 310 of the second sub-package SP2. The inter-package connecting unit 270 may connect the first sub-package SP1 and the second sub-package SP2. The inter-package connecting unit 270 may comprise, for example, gold (Au), copper (Cu), nickel (Ni), tin (Sn), and lead (Pb), or a combination thereof. The inter-package connecting unit 270 may include, for example, a solder ball.

Figure 6:
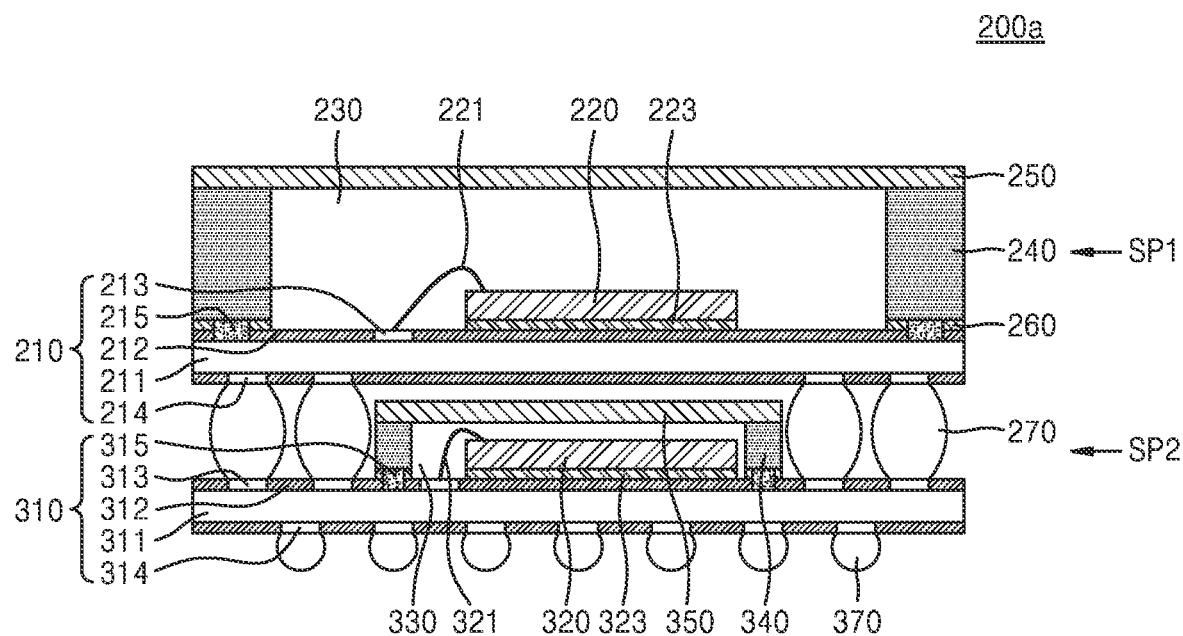
FIG. 6 is a cross-sectional view of another example of a semiconductor package according to the inventive concept.

FIG. 6 is a cross-sectional view of another example of a semiconductor package 200a according to the inventive concept. Hereinafter, mainly only the differences between the semiconductor package 200 shown in FIG. 5 and the semiconductor package 200a shown in FIG. 6 will be described.

Referring to FIG. 6, the second sub-package SP2 may further include a second shielding wall 340 and a second shielding cover 350.

The second shielding wall 340 may extend circumferentially around (surround sides of) the second molding unit 330. A plurality of the inter-package connecting units 270 may be arranged around the second shielding wall 340. One end of the second shielding wall 340 may be in contact with a protruding unit 315 of the second package substrate 310 and the other end of the second shielding wall 340 may be in contact with the second shielding cover 350.

In some examples, the second shielding wall 340 is attached to the second package substrate 310 by a second shielding wall adhesive layer 360. The second shielding wall adhesive layer 360 may be positioned between the solder resist layer 312 of the second package substrate 310 and the second shielding wall 340. The protruding unit 315 of the second package substrate 310 may extend through the second shielding wall adhesive layer 360.

The second shielding cover 350 may cover an upper surface of the second molding unit 330 and be in contact with the second shielding wall 340.

Figure 7:
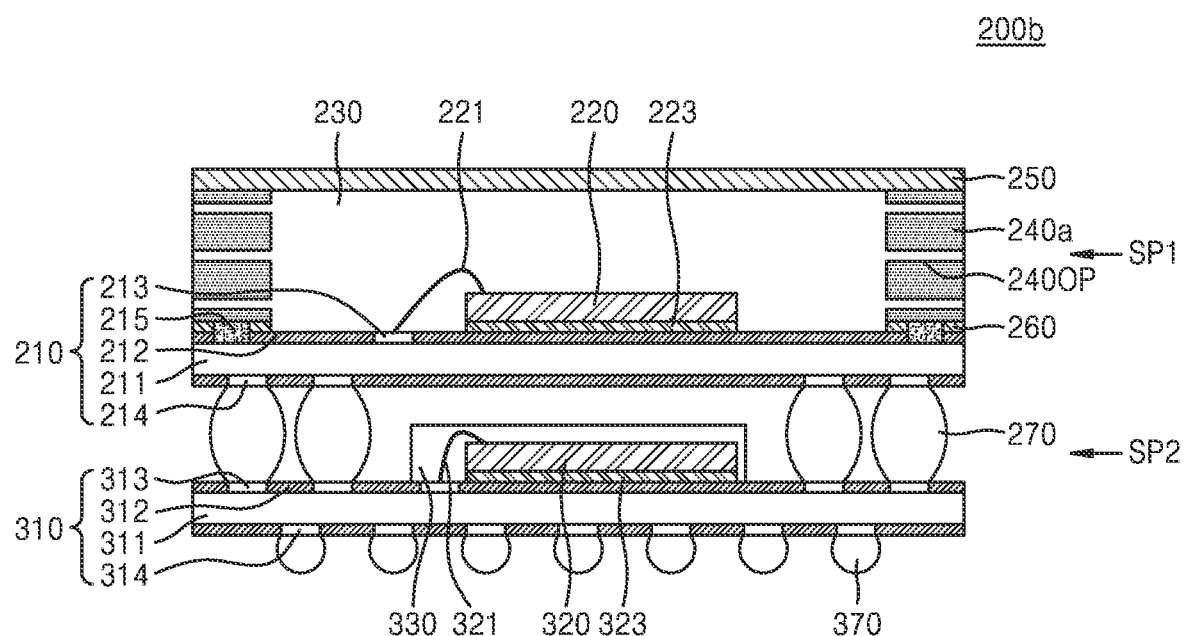
FIG. 7 is a cross-sectional view of another example of a semiconductor package according to the inventive concept.

FIG. 7 is a cross-sectional view of still another example of a semiconductor package 200b according to the inventive concept. Hereinafter, mainly only the differences between the semiconductor package 200 of FIG. 5 and the semiconductor package 200b of FIG. 7 will be described.

Referring to FIG. 7, a first shielding wall 240a may have at least one opening 240OP extending radially therethrough. The opening 240OP may be a hole or a slit. The dimensions of the opening 240OP are so small that the first shielding wall 240a is still able to effect an electromagnetic shielding of the at least one chip 220. When a space surrounded by the shielding wall 240a is filled with molding material to form the molding unit 230, the opening 240OP allows excess molding material to pass through the shielding wall 240a.

FIGS. 8A to 8D are illustrate an example of a method of fabricating a semiconductor package according to the inventive concept. In this figures, elements of the package previously described with reference to FIGS. 1-3 will be denoted by like reference numerals.

Figure 8A:
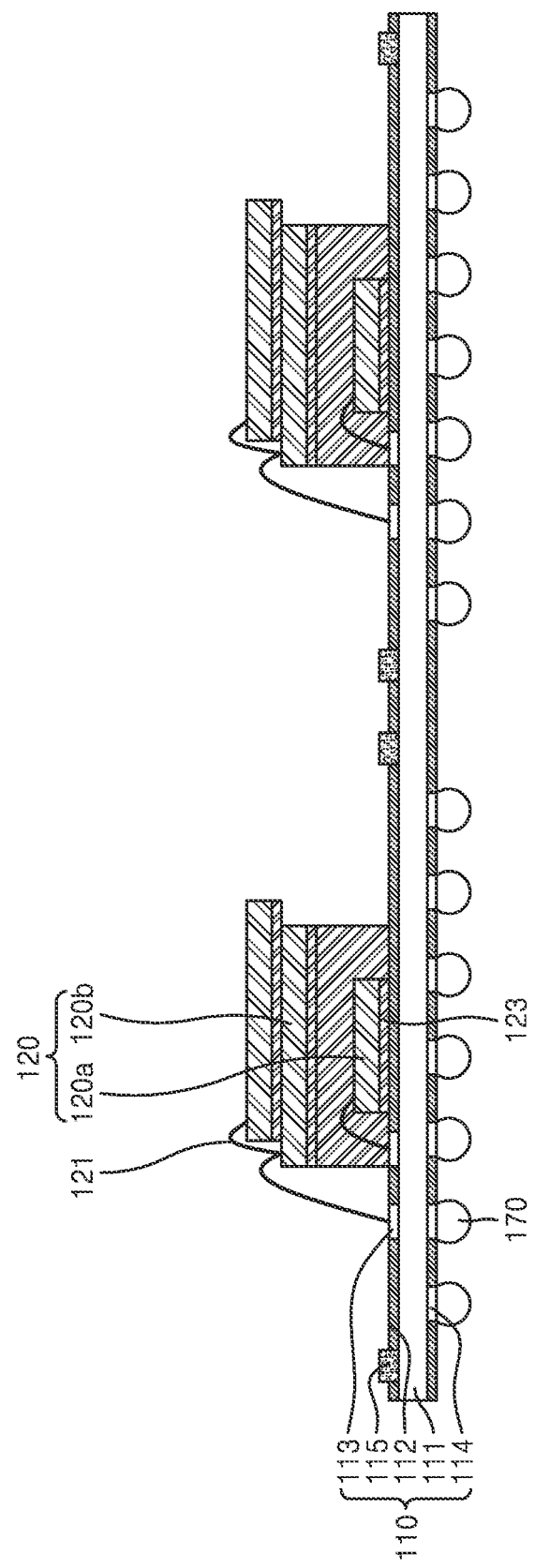

Referring to FIG. 8A, package substrate 110 is provided. The package substrate 110 includes at least one base layer (or simply "base") 111, solder resist layer 112 covering the upper surface and the lower surface of the base layer 111, upper pads 113 above the upper surface of the base layer 111, lower pads 114 on the lower surface of the base layer 111, and a protruding unit 115 protruding through the solder resist layer 112 from the upper surface of the package substrate 110.

External connecting unit 170 may be formed by forming electrically conductive terminals on the lower surface of the package substrate 110. For example, the external connecting unit 170 may be formed by attaching solder balls on the lower surface of the package substrate 110.

In addition, at least one semiconductor chip 120, e.g., first semiconductor chip 120a and the plurality of second semiconductor chips 120b, is/are attached within a chip mounting region to an upper surface of the package substrate 110 by chip adhesive layer 123. In the illustrated example, a lateral array of single and/or stacked chips is mounted to the package substrate 110 within respective chip mounting regions above the package substrate 110.

Figure 8B:
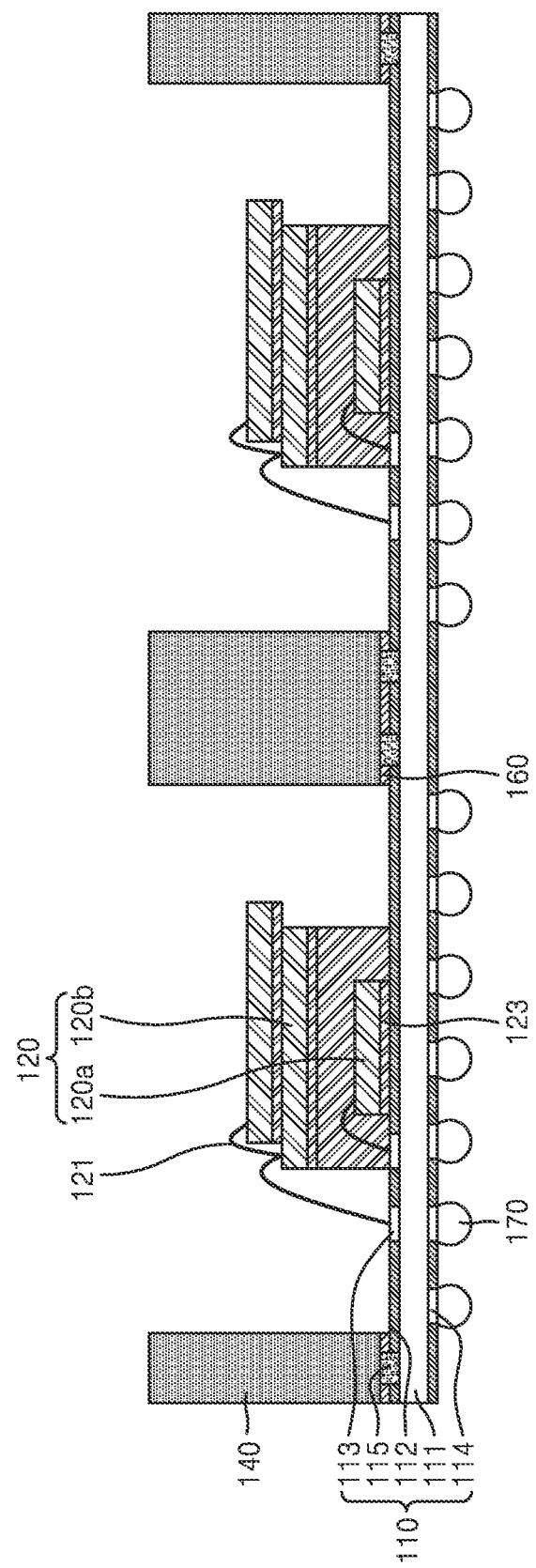

Referring to FIG. 8B, the shielding wall 140 is formed on the package substrate 110. The shielding wall 140 may be attached to the upper surface of the package substrate 110 by shielding wall adhesive layer 160. For example, the shielding wall adhesive layer 160 may be formed on the package substrate 110, the shielding wall 140 may be placed over the shielding wall adhesive layer 160 and the shielding wall 140 may be pressed toward with the package substrate 110 by applying a force to the shielding wall 140.

In some examples, the shielding wall 140 is pressed into contact with the protruding unit 115 of the package substrate 110. In this case, the shielding wall adhesive layer 160 may be formed so as to cover the protruding unit 115. After placing the shielding wall 140 above the shielding wall adhesive layer 160, a force may be applied to the shielding wall 140 such that the protruding unit 115 of the package substrate 110 is forced through the shielding wall adhesive layer 160 and into contact with the shielding wall 140.

Referring to FIG. 8C, the molding unit 130 is formed in spaces (the chip mounting regions) delimited by the shielding wall 140 and the package substrate 110. First, mold material, i.e., a molding compound, is deposited on the upper surface of the package substrate 110 in the spaces delimited by the shielding wall 140. Then, the mold material is cured, e.g., exposed to UV light, or allowed to cure. Hence, molded bodies, i.e., bodies of material molded by the shielding wall 140, package substrate 110, etc., are formed in the spaces (the chip mounting regions), respectively.

Figure 8D:
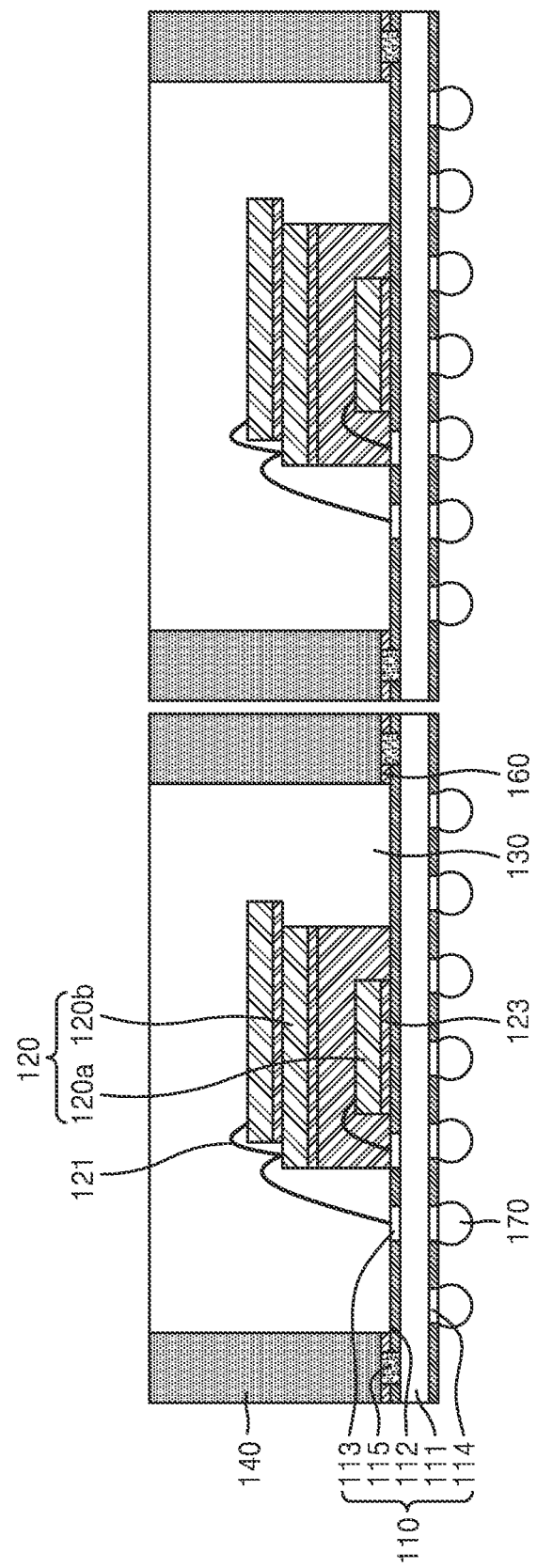

Referring to FIG. 8D, the shielding wall 140 and the package substrate 110 may be cut to separate the package substrate 110 and shielding wall 140 between the semiconductor chip stacks, thereby producing a plurality of discrete units of the semiconductor packages.

Referring to FIG. 1, shielding cover 150 may be formed above the molding unit 130. The shielding cover 150 may be formed by, for example, attaching an electromagnetic absorbing tape to the top surface of the molding unit 130. Alternatively, the shielding cover 150 may be formed by spraying electromagnetic absorbing (shielding) material onto the top of the molding unit 130. In either case, the shielding cover 150 may also be attached to and cover the upper end of the shielding wall 140.

In a fabrication method according to the inventive concept as described above, the shielding wall 140 and the shielding cover 150 may be formed easily, quickly and inexpensively.

Figure 9:
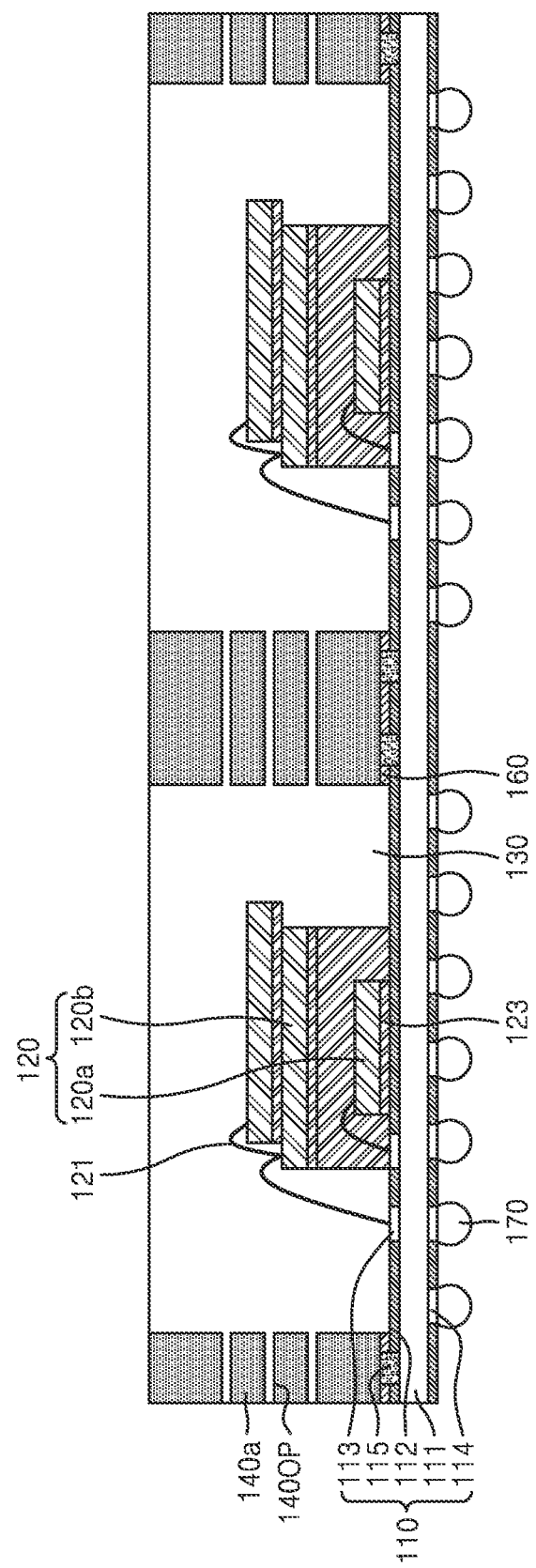
FIG. 9 is a cross-sectional view of an intermediate product in a phase of an example of a method of mass producing semiconductor packages according to the inventive concept.

FIG. 9 illustrates a stage in an example of a method of fabricating a semiconductor package, of the type shown in and described with reference to FIG. 4, according to the inventive concept. The other stages of the method are similar to those shown in and described with reference to FIGS. 8A-8D.

Referring to FIGS. 4 and 9, the shielding wall 140a has at least one opening 140OP. Excess molding material, namely, molding material that has filled the space delimited by the shielding wall 140a when the molding unit 130 is being formed, may pass into and even through outer ones the openings 140OP in the shielding wall 140a if excess molding material is forced by the molding process into the space. Therefore, the molding unit 130 may be formed easily and without damaging the components in and delimiting the space.

Figure 10:
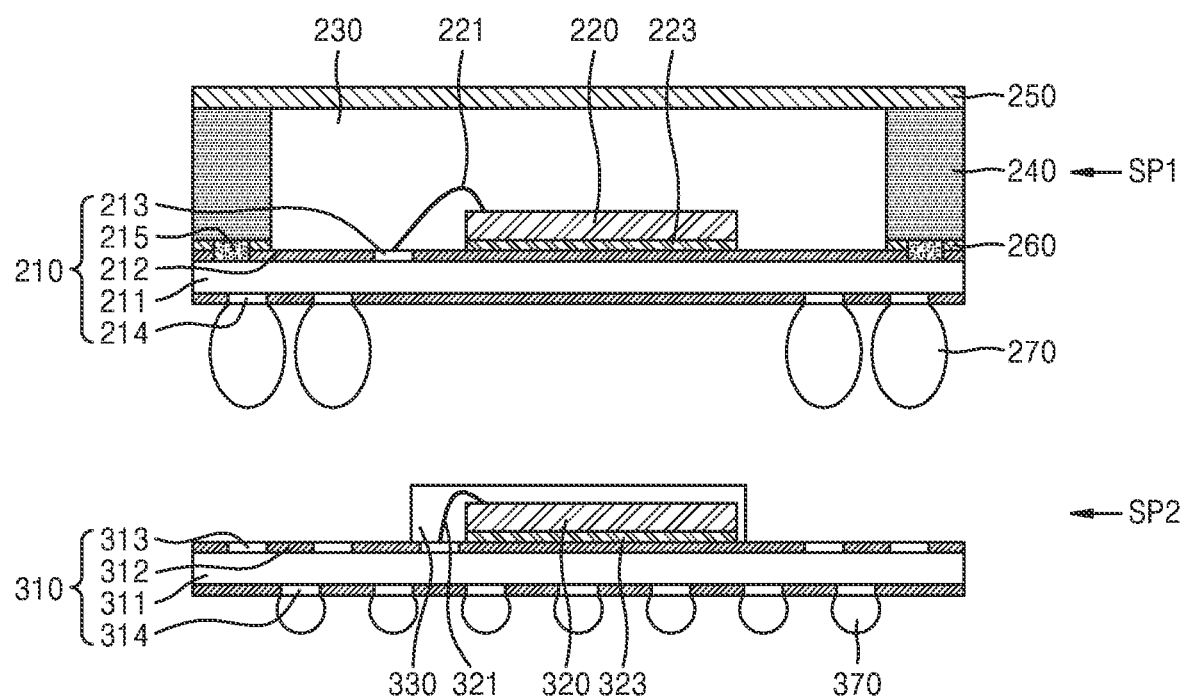
FIG. 10 is a cross-sectional view of a semiconductor package during the course of its manufacture illustrating an example of a method of fabricating a semiconductor package according to the inventive concept.

FIG. 10 illustrates a stage in an example of a method of fabricating a semiconductor package of the type shown in and described with reference to FIG. 5, according to the inventive concept.

Referring to FIG. 10, the first sub-package SP1 is prepared. The first sub-package SP1 may be prepared in a method similar to that shown in and described with reference to FIGS. 8A to 8D.

First, the first package substrate 210 is provided. The first package substrate 210 includes the base layer 211, the solder resist layer 212 covering the upper surface and the lower surface of the base layer 211, the upper pad 213 above the upper surface of the base layer 211, the lower pad 214 on the lower surface of the base layer 211, and the protruding unit 215 protruding through the solder resist layer 212.

The inter-package connecting unit 270 is formed on a lower surface of the first package substrate 210. For example, the inter-package connecting unit 270 may be formed by attaching solder balls to the lower surface of the first package substrate 210. In addition, the first semiconductor chip 220 is attached to an upper surface of the first package substrate 210 by the chip adhesive layer 223.

Next, the first shielding wall 240 is attached to the first package substrate 210. The first shielding wall 240 may be attached to the first package substrate 210 by the first shielding wall adhesive layer 260.

Then, the first molding unit 230 is formed in a space surrounded by the first shielding wall 240.

Next, the first shielding wall 240 and the first package substrate 210 may be cut.

Then, the first shielding cover 250 may be formed atop the first molding unit 230. The first shielding cover 250 may be formed by, for example, attaching an electromagnetic radiation absorbing tape to the top surface of the first molding unit 230 (and to an upper end of the first shielding wall 240). Alternatively, the first shielding cover 250 may be formed by spraying the top surface of the first molding unit 230 (and upper end of the first shielding wall 240) with an electromagnetic radiation absorbing (shielding) material.

Meanwhile, the second sub-package SP2 is prepared. First, the second package substrate 310 is provided. The second package substrate 310 includes the base layer 311, the solder resist layer 312 covering the upper surface and the lower surface of the base layer 311, the upper pads 313 on the upper surface of the base layer 311, the lower pads 314 on the lower surface of the base layer 311, and the protruding unit 315 extending through the solder resist layer 312.

The external connecting unit 370 is formed on a lower surface of the second package substrate 310. For example, the external connecting unit 370 may be formed by attaching solder balls to the lower surface of the second package substrate 310. In addition, the second semiconductor chip 320 is attached to an upper surface of the second package substrate 310 by the chip adhesive layer 323. Next, the second molding unit 330 extending circumferentially around the second semiconductor chip 320 is formed.

Then, the first sub-package SP1 is to the second sub-package SP2. Thus, the semiconductor package 200 shown in FIG. 5 may be fabricated.

Furthermore, the preparing of the second sub-package SP2 may also include attaching the second shielding wall 340 to the package substrate, forming molding unit 330 in the space delimited by the second shielding wall 340 and package substrate 3100, and attaching the second shielding cover 350 to the top surface of the molding unit 330 and upper end surface of the second shielding wall 340. In this case, the semiconductor package 200a shown in FIG. 6 may be fabricated.

Finally, examples of the inventive concept have been described above in detail. The inventive concept may, however, be put into practice in many different ways and should not be construed as being limited to the examples described above. Rather, these examples were described so that this disclosure is thorough and complete, and fully conveys the inventive concept to those skilled in the art. Thus, the true spirit and scope of the inventive concept is not limited by the examples described above but by construing the following claims.

What is claimed is:

1. A semiconductor package comprising:
   a package substrate;
   at least one semiconductor chip on an upper surface of the package substrate;
   a conductive wall that extends around sides of the at least one semiconductor chip above the package substrate;

a molded body covering the at least one semiconductor chip and at least a portion of the upper surface of the package substrate;

a shielding cover that covers the molded body and the conductive wall; and an adhesive between the conductive wall and the package substrate, wherein the package substrate comprises a base, a solder resist layer on an upper surface of the base, and a protrusion contacting the base and extending into the solder resist layer, and the protrusion is electrically connected to the conductive wall.

2. The semiconductor package of claim 1, wherein a thickness of the conductive wall in a direction parallel to the upper surface of the base of the package substrate is greater than a width of the protrusion in a direction parallel to the upper surface of the base of the package substrate.

3. The semiconductor package of claim 1, wherein a thickness of the conductive wall in a direction parallel to the upper surface of the base of the package substrate is greater than a distance from the solder resist layer to an upper surface of the protrusion in a direction perpendicular to the upper surface of the package substrate.

4. The semiconductor package of claim 1, wherein the adhesive is located between the conductive wall and the solder resist layer.

5. The semiconductor package of claim 4, wherein the adhesive is in contact with the protrusion and the conductive wall.

6. The semiconductor package of claim 1, wherein the molded body is in contact with an inner surface of the conductive wall.

7. The semiconductor package of claim 1, wherein the conductive wall has at least one opening extending therethrough from an inner peripheral surface to an outer peripheral surface thereof.

8. The semiconductor package of claim 7, wherein at least part of the molded body is located in the at least one opening.

9. The semiconductor package of claim 1, wherein the semiconductor package includes a first sub-package, a second sub-package, and a plurality of inter-package connecting unit connecting the first sub-package and second sub-package.

10. The semiconductor package of claim 9, wherein each of the first sub-package and the second sub-package includes the conductive wall, the molded body, and the shielding cover.

11. A semiconductor package comprising:
a package substrate;
at least one semiconductor chip on an upper surface of the package substrate;
a conductive wall that extends around sides of the at least one semiconductor chip above the package substrate;
a molded body covering the at least one semiconductor chip and at least a portion of the upper surface of the package substrate; and
an adhesive between the conductive wall and the package substrate,
wherein the package substrate comprises a base, a solder resist layer on an upper surface of the base, and a protrusion contacting the base and extending into the solder resist layer,
wherein the conductive wall is spaced apart from the at least one semiconductor chip, and
the protrusion is electrically connected to the conductive wall.

12. The semiconductor package of claim 11, wherein the protrusion extends through the conductive wall.

13. The semiconductor package of claim 11, wherein the adhesive surrounds the protrusion.

14. The semiconductor package of claim 11, wherein the protrusion is grounded.

15. The semiconductor package of claim 11, wherein the protrusion is contiguous along a closed loop as viewed in a plan view of the semiconductor package.

16. A semiconductor package comprising:
a package substrate;
at least one semiconductor chip on an upper surface of the package substrate;
a conductive wall that extends around sides of the at least one semiconductor chip above the package substrate;
a molded body covering the at least one semiconductor chip and at least a portion of the upper surface of the package substrate;
a shielding cover that covers the molded body and the conductive wall; and
an adhesive between the conductive wall and the package substrate,
wherein the package substrate comprises a base, a solder resist layer on an upper surface of the base, and a protrusion contacting the base and extending into the solder resist layer,
wherein a thickness of the conductive wall in a direction parallel to the upper surface of the base of the package substrate is greater than a width of the protrusion in a direction parallel to the upper surface of the base of the package substrate, and
the protrusion is electrically connected to the conductive wall and is grounded.

17. The semiconductor package of claim 16, wherein the conductive wall is grounded through the protrusion.

18. The semiconductor package of claim 16, wherein the shielding cover is grounded through the conductive wall and the protrusion of the package substrate.

19. The semiconductor package of claim 16, wherein the protrusion comprises a plurality of portions spaced apart from one another and each disposed adjacent to a respective one of sides of the package substrate.

20. The semiconductor package of claim 16, wherein the package substrate has four sides and the protrusion consists of four portions adjacent to the four sides of the package substrate, respectively.

* * * * *